United States Patent
Su

(10) Patent No.: US 10,171,092 B2
(45) Date of Patent: Jan. 1, 2019

(54) TIME CLOCK SIGNAL PROCESSING SYSTEM AND METHOD THEREOF

(71) Applicant: LYRA SEMICONDUCTOR INCORPORATED, Jhubei (TW)

(72) Inventor: Ming-Tang Su, Hsinchu County (TW)

(73) Assignee: LYRA SEMICONDUCTOR INCORPORATED, Hsinchu County (TW)

( * ) Notice: Subject to any disclaimer, the term of this patent is extended or adjusted under 35 U.S.C. 154(b) by 0 days.

(21) Appl. No.: 15/481,536

(22) Filed: Apr. 7, 2017

(65) Prior Publication Data
US 2018/0269882 A1    Sep. 20, 2018

(30) Foreign Application Priority Data

Mar. 14, 2017  (TW) ............................. 106108232 A

(51) Int. Cl.
*H03L 7/087* (2006.01)
*H03L 7/093* (2006.01)

(52) U.S. Cl.
CPC .............. *H03L 7/087* (2013.01); *H03L 7/093* (2013.01)

(58) Field of Classification Search
CPC ..... H03L 7/06; H03L 7/07; H03L 7/08; H03L 7/085; H03L 7/087; H03L 7/093
USPC .................................................. 327/156–158
See application file for complete search history.

(56) References Cited

U.S. PATENT DOCUMENTS

| | | | | |
|---|---|---|---|---|
| 2006/0021491 | A1* | 2/2006 | Greco | H03L 7/0995 84/293 |
| 2006/0023824 | A1* | 2/2006 | Greco | H03L 7/0995 375/371 |
| 2011/0078355 | A1* | 3/2011 | Tan | G06F 13/4273 710/305 |
| 2016/0204784 | A1* | 7/2016 | Trotta | H01Q 3/30 342/354 |

\* cited by examiner

*Primary Examiner* — Lincoln D Donovan
*Assistant Examiner* — Diana J. Cheng
(74) *Attorney, Agent, or Firm* — Lin & Associates Intellectual Property, Inc.

(57) ABSTRACT

A time clock signal processing system and method thereof, applicable to an environment of USB synchronous mode audio clock reconstruction, is disclosed. The clock signal processing method employed by the clock signal processing system first uses a first-stage phase-locked loops (PLL) to raise the frequency of the inputted USB start-of-frame (SOF) field, provides clock synchronization and outputs the second-stage PLL; then, the second-stage PLL reduces the timing jitter of the output of the first-stage PLL to below 20 ps.

8 Claims, 10 Drawing Sheets

TIME CLOCK SIGNAL PROCESSING SYSTEM AND METHOD THEREOF

CROSS-REFERENCE TO RELATED APPLICATION

The present application is based on, and claims priority from, Taiwan Patent Application No. 106108232, filed Mar. 14, 2017 the disclosure of which is hereby incorporated by reference herein in its entirety.

TECHNICAL FIELD

The technical field generally relates to a signal processing system and method, and in particular, to a signal processing system and method, applicable to an environment of audio clock reconstruction for USB audio synchronous mode, by increasing the frequency of USB start of frame (SOF), providing clock synchronization, and reducing the timing jitter to below 20 ps.

BACKGROUND

The current USB defines four transmission modes: (1) control transfers, for control transfer commands and state operation, such as, configuring the device, obtaining device information, sending commands to device, and so on; each USB device having an endpoint 0, USB core is configured after device plug-in; (2) interrupt transfers, different from the general interruption, and requiring the host polling before execution to transfer a small amount of data at a fixed speed, such as, USB keyboard, mouse; (3) bulk transfer, for sending a large amount of data and requiring to guarantee data correctness, such as, transferring to flash drive, not restricted by speed limits; re-transmitting when the original transmission fails to guarantee data correctness; and (4) isochronous transfers, for sending a large amount of data without guaranteeing data correctness, such as, USB video device, best effort for stable transmission speed for audio and video; however, neither CRC nor re-transmission if frames are lost.

The transaction transfer indicates USB data transfer. The majority of transfer includes three types of packets: token packets, data packets, and handshake or status packets. The transaction transfer may be from the host outbound to the device, or from the device inbound to the host. The transfer direction is designated in the token packet. In general, the destination uses the handshake (status) packet to determine whether the transfer succeeds.

To ensure synchronization, USB divides the time into small intervals of fixed length. For example, the unit is 1 ms for low speed and full speed, called a frame; the frame is divided into 8 parts (with 0.125 ms as a unit), called a microframe. The start-of-frame (SOF) packet is a special packet, which is sent at the start of each frame.

The USB synchronous mode needs a clock CLK to drive the digital-analog-converter (DAC) and analog-digital-converter (ADC) in playing and recording, and the clock CLK must be synchronized with the USB data reception and transmission. For example, the clock CLK must be synchronized with the data stream speed transmitted from the USB host so as to avoid discontinuity, leading to discontinuous audio.

The earliest approach is to use a single phase-locked loop (PLL) to increase the frequency of the USB SOF (such as, 1 KHz for full speed, or 8 KHz for high speed) to 1024*48 KHz. However, with a single PLL increasing the USB SOF frequency, such as, from 1 KHz by 49152 times, the signal clock will tremble severely, causing noises in DAC and ADC.

The current USB AUDIO solution company proposed an adaptive mode, wherein the USB device uses two deep first-in-first-out (FIFO) buffers (with depth greater than 1000, for example) to respectively store data received from and to be transmitted to the USB host. Then, the controller dynamically adjusts the local clock synthesizer frequency to adjust the DAC/ADC speed so that the data depth in the buffers remains within a range (for example, default upper bound and lower bound), and controls the PLL clock CLK to adjust the access speed of the buffers to stay within a range. However, the adaptive mode has two disadvantages. The first is the dynamic adjustment of the clock synthesizer will cause larger timing jitter (usually larger than 200 ps) and lead to poor audio quality, and the second is that the deep buffers lead to playback delay.

For the current use of FIFO buffers, U.S. Pat. No. 7,715,513 "Data synchronization apparatus" disclosed a data synchronization apparatus comprising a FIFO register, a control circuit and a PLL; wherein the FIFO register receives and stores a plurality of data and provides a register adjustment signal according to the amount of data stored in the FIFO register; the data stored in the FIFO registers are transmitted to an external device at a clock rate obtained from a main clock signal; the control circuit provides an adjustment signal to PLL according to the adjustment signal of the FIFO register; and the PLL provides the main clock signal and adjusts the frequency of the main clock signal according to the PLL adjustment signal. In other words, the FIFO registers are used as buffers and then the speed of the PLL is adjusted to avoid discontinuity in USB playback.

Moreover, the USB audio method from Cypress Semiconductor Corp. also uses FIFO buffers and adjusts the PLL speed to avoid discontinuity in USB playback.

Taiwan Patent No. 1557573 "Portable Storage Apparatus and Method Thereof, and Non-volatile Machine Readable Medium" disclosed a portable storage apparatus for obtaining a version of a first file from a first computation device and updating the first file in the portable storage apparatus to form an updated first file; then, the portable storage apparatus determining a version of the first file on a second computation device different from the updated first file in the portable storage apparatus and providing the updated first file to the second computation device; moreover, the portable storage apparatus determining a version of the first file on a remote storage service different from the updated first file and providing the updated first file to the remote storage service.

Taiwan Patent No. I544337 "Dual Operating System Architecture for USB Device and Method of USB device of Dual Operating System architecture disclosed a dual operating system architecture sharing USB device, comprising: a first operation system, a second operating system, a USB hub connected to a plurality of USB devices, and a switch for connecting the second operating system to the USB hub and cutting off connection between the first operating system and the USB hub when switching from the first operating system to the second operating system.

Taiwan Patent No. I540426 "Dynamic Adjustment based on Hot Condition for Mobile Device" disclosed a mobile device able to monitor, by configuration, an environment, system or user event related to the mobile and/or a same-stage device. The occurrence of one or more events can trigger the adjustment of the system configuration. The mobile device is configurable to keep the frequently applications predicted based on the user's access most updated. The mobile device can receive push notification related to the applications, and the push notifications indicate new content to be downloaded by the applications. The mobile device can activate, in the background, the applications related to the push notifications to download the new content. Before executing an application or communicating with a same-stage device, the mobile device is configurable to check power in the mobile device and/or the same-stage device, data budget, and environment conditions to ensure a high-quality user experience.

Therefore, the issues remained to be solved include how to avoid large timing jitter of the signal when using a single PLL to increase the USB SOF frequency, such as from 1 KHz to 49152 times, causing large noise in DAC and ADC, as well as, how to avoid large timing jitter (>200 ps) and poor audio quality caused by dynamic adjustment of clock synthesizer when using adaptive mode, and avoid playback delay due to the use of deep buffers.

SUMMARY

An object of the present invention is to provide a clock signal processing system and method, applicable to an environment of audio clock reconstruction for USB audio synchronous mode, by using a first-stage phase locked loop (PLL) to increase the frequency of USB start of frame (SOF), providing clock synchronization, and outputting to a second-stage PLL; then, using the second-stage PLL to reduce the timing jitter outputted by the first-stage PLL to below 20 ps.

Another object of the present invention is to provide a clock signal processing system and method, applicable to an environment of audio clock reconstruction for USB audio synchronous mode, by using dual PLLs to lock and synchronization clock with system on chip (SOC).

Yet another object of the present invention is to provide a clock signal processing system and method, applicable to an environment of audio clock reconstruction for USB audio synchronous mode, by using the first-stage PLL to increase the USB SOF to 49152 times, mainly providing clock synchronization, and the second-stage PLL to reduce the output timing jitter of the first-stage PLL to below 20 ps.

Yet another object of the present invention is to provide a clock signal processing system and method, applicable to an environment of audio clock reconstruction for USB audio synchronous mode, when the DAC/ADC clock synchronized with USB SOF, a small buffer (<100) can be used to store the amount of data SOF data without using deep buffer (>1000) to achieve normal discontinuity-free playback; and moreover, with a small buffer, the audio delay is also improved to below 1 ms.

Yet another object of the present invention is to provide a clock signal processing system and method, applicable to an environment of audio clock reconstruction for USB audio synchronous mode, able to improve timing jitter, greatly reduce FIFO buffer size, increase audio SNR, and reduce audio delay.

To achieve the aforementioned objects, the present invention provides a clock signal processing system, comprising: a USB interface, a first-stage phase-locked loop (PLL), a second-stage PLL, a first first-in-first-out (FIFO) buffer, and a second FIFO buffer.

The first-stage PLL: the first-stage PLL is connected to the USB interface, the USB interface receives/transmits to input/output audio data from/to USB host, the USB interface transmits the start of frame (SOF) to an input end of the first-stage PLL, the USB interface transmits pulse code modulation (PCM IN) signal to the first FIFO buffer, the USB interface then receives pulse code modulation signal (PCM OUT) from the second FIFO buffer; and after the first-stage PLL receives the SOF, for example, the first-stage PLL will output a 49152-times clock to the second-stage PLL, and the tasks performed by first-stage PLL are frequency increase/clock synchronization.

The second-stage PLL: the second-stage PLL will improve the clock signal of the synchronization clock received from the first-stage PLL after frequency increase; the second-stage PLL reduces the timing jitter of the clock signal, and then outputs the clock signal after timing jitter processing to digital-analog-converter (DAC) and analog-digital-converter (ADC); wherein the second-stage PLL reduces the timing jitter of the first-stage PLL output to below 20 ps.

The first FIFO buffer: the first FIFO buffer is for the DAC to temporarily store a small amount of data (depth<100), and is able to store a SOF data transmitted from a host via the USB interface, and the data can be read by the DAC.

The second FIFO buffer: the second FIFO buffer is to temporarily store a small amount of data (depth<100) to be outputted by ADC, via the USB interface, the data in the second FIFO buffer is read by way of each SOF and transmitted to the host.

The clock signal processing system of the present invention uses the first-stage PLL and the second-stage PLL, with the first-stage PLL to increase the frequency of the SOF (1 KHz or 8 KHz), and the second-stage PLL to perform timing jitter reduction clock signal of the synchronization clock after frequency increase so that the clock signal (such as, 1024*48KHz) after timing jitter reduction is provided to the DAC and ADC. When stabilized, the clock CLK of the DAC is synchronized with the SOF and the audio data of the audio from the USB interface is also synchronized with the SOF; therefore, the clock CLK used by the DAC is synchronized with the data DATA of the first FIFO buffer and without discontinuity. As a result, the first FIFO buffer is only necessary to accommodate the data amount of an SOF, and hence, the data delay from the USB host, USB interface to the DAC is very short.

In the embodiment of the present invention, the first-stage PLL may comprise a first phase detector (PD), a first low-pass filter (LPF), a first voltage-controlled oscillator (VCO), and a first frequency divider; wherein the first PD performs the phase difference detection between the SOF and the output of the first frequency divider (dividing by 49152), and transmits the detection result to the first LPF; and the first LPF performs low-pass filtering on the signal with phase difference and transmits to the first VCO, the first LPF is designed to be able to accept very low frequency input (as low as 1 KHz).

Moreover, in the embodiment of the present invention, the second-stage PLL may comprise a second phase detector (PD), a second low-pass filter (LPF), a second voltage-controlled oscillator (VCO), and a second frequency divider; wherein the second PD performs the phase difference detection between the clock signal of the synchronization clock after frequency increase by the first-stage PLL and the output of the second VCO, and transmits the detection result to the second LPF; the design objective of the second LPF, different from the first LPF, is to reduce the timing jitter of the clock signal of the synchronization clock after frequency increase by the first-stage PLL, which requires the second LPF to be designed in an over-damping state and the stabilization time is within a few ms; and, the output of the second VCO is transmitted to the second frequency divider, and the second frequency divider divides the output by 2; the second frequency divider performs duty cycle adjustment so as to output the signal to DAC and ADC for use.

When the clock signal processing system of the present invention uses the clock signal processing method, the process is as follows: first, performing frequency increase: using the first-stage PLL via the USB interface to increase the frequency of the inputted USB SOF and providing the synchronization clock and outputting to the second-stage PLL.

Wherein the first-stage PLL, after receiving the SOF, for example, will output a clock of 49152 times to the second-stage PLL; the first-stage PLL serves to perform frequency increase/clock synchronization.

Then, performing timing jitter: using the second-stage PLL to reduce the timing jitter of the clock signal outputted by the first-stage PLL to below 20 ps.

Wherein, the second-stage PLL improves the clock signal of the synchronization clock after frequency increase by the first-stage PLL; the second-stage PLL reduces the timing jitter of the clock signal, and outputs the clock signal after jittery processing to DAC and ADC; and, the second-stage PLL reduces the timing jitter of the clock signal outputted by the first-stage PLL to below 20 ps.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

Figure 1:
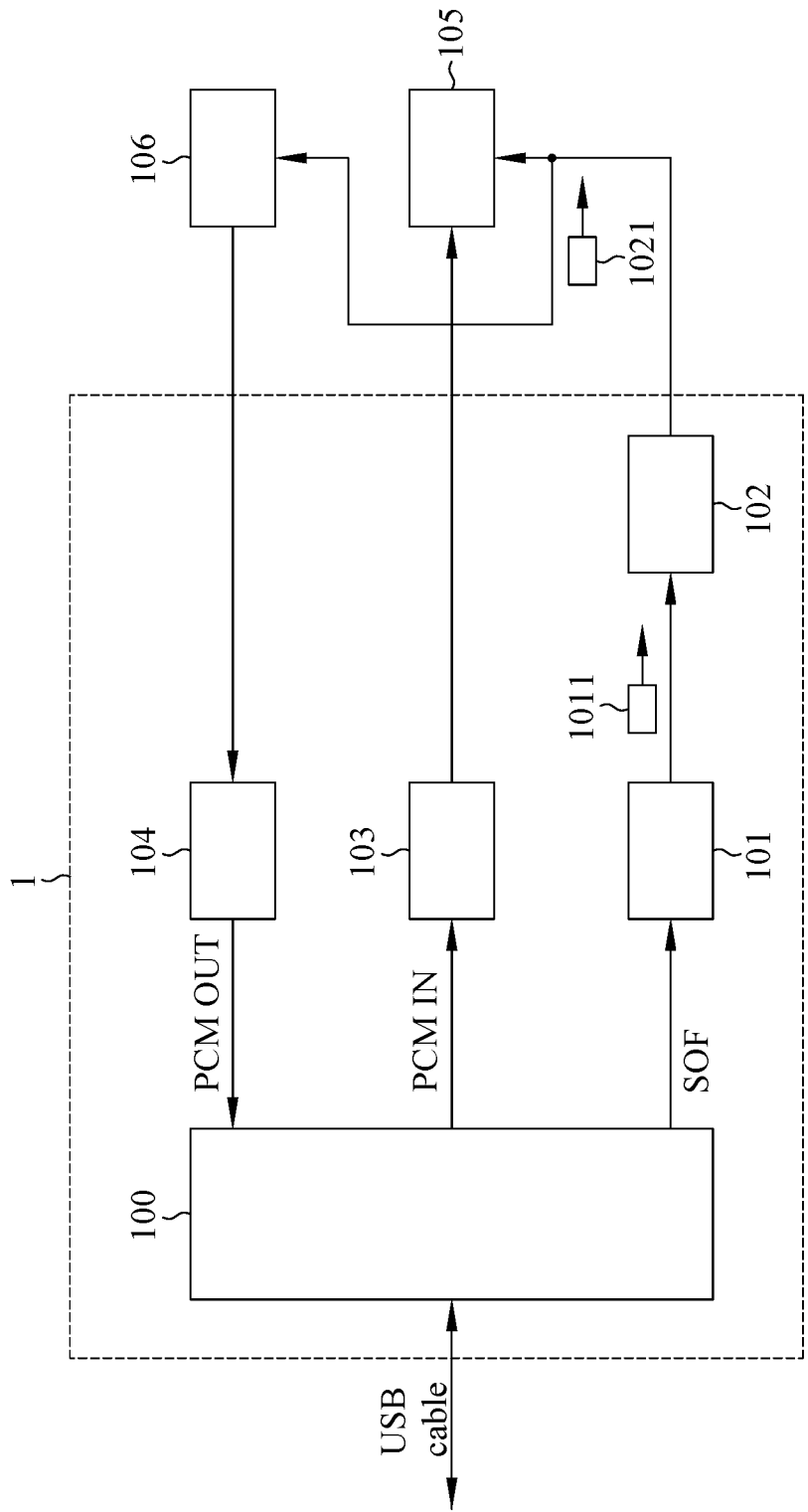
FIG. 1 shows a schematic view of the clock signal processing system collaborating with USB interface, DAC and ADC in accordance with an exemplary embodiment.

FIG. 1 shows a schematic view of the clock signal processing system and operation in collaboration with USB interface, DAC, and ADC in accordance with an exemplary embodiment. As shown in FIG. 1, the clock signal processing system 1 comprises a USB interface 100, a first-stage phase-locked loop (PLL) 101, a second-stage PLL 102, a first first-in-first-out (FIFO) buffer 103, and a second FIFO buffer 104.

The first-stage PLL101: the first-stage PLL 101 is connected to the USB interface 100, the USB interface 100 receives/transmits to input/output audio data from/to USB host (not shown) via a USB cable, the USB interface 100 transmits the start of frame (SOF) to an input end of the first-stage PLL 101, the USB interface 100 transmits pulse code modulation (PCM IN) signal to the first FIFO buffer 103, the USB interface 100 then receives pulse code modulation signal (PCM OUT) from the second FIFO buffer 104; and after the first-stage PLL 101 receives the SOF, for example, the first-stage PLL 101 will output a 49152-times clock to the second-stage PLL 102, and the tasks performed by first-stage PLL 101 is frequency increase/clock synchronization.

The second-stage PLL 102: the second-stage PLL 102 will improve the clock signal 1011 of the synchronization clock received from the first-stage PLL 101 after frequency increase; the second-stage PLL 102 reduces the timing jitter of the clock signal 1011, and then outputs the clock signal 1021 after timing jitter processing to digital-analog-converter (DAC) 105 and analog-digital-converter (ADC) 106; wherein the second-stage PLL 102 reduces the timing jitter of the first-stage PLL 101 output to below 20 ps.

The first FIFO buffer 103: the first FIFO 103 buffer is for the DAC 105 to temporarily store a small amount of data (depth<100), and is able to store a SOF data (not shown) transmitted from a host via the USB interface 100, and the data can be read by the DAC 105.

The second FIFO buffer 104: the second FIFO buffer 104 is to temporarily store a small amount of data (depth<100) to be outputted by ADC 106, via the USB interface 100, the data in the second FIFO buffer 104 is read by way of each SOF and transmitted to the host.

In actual application, the clock signal processing system of the present invention uses the first-stage PLL 101 and the second-stage PLL 102, with the first-stage PLL 101 to increase the frequency of the SOF (1 KHz or 8 KHz), and the second-stage PLL 102 to perform timing jitter reduction on clock signal 1011 of the synchronization clock after the frequency increase so that the clock signal 1021 (such as, 1024*48KHz) after timing jitter reduction is provided to the DAC 105 and ADC 106. When stabilized, the clock CLK of the DAC 105 is synchronized with the SOF and the audio data of the audio from the USB interface 100 is also synchronized with the SOF; therefore, the clock CLK used by the DAC 105 is synchronized with the data DATA of the first FIFO buffer 103 and without discontinuity. As a result, the first FIFO buffer 103 is only necessary to accommodate the data amount of an SOF, and hence, the data delay from the USB host, USB interface 100 to the DAC 105 is very short.

In the embodiment of the present invention, the first-stage PLL 101 may comprise a first phase detector (PD), a first low-pass filter (LPF), a first voltage-controlled oscillator (VCO), and a first frequency divider (1/N); wherein the first PD performs the phase difference detection between the SOF and the output of the first frequency divider (dividing by 49152), and transmits the detection result to the first LPF; and the first LPF performs low-pass filtering on the signal with phase difference and transmits to the first VCO, the first LPF is designed to be able to accept very low frequency input (as low as 1 KHz).

Moreover, in the embodiment of the present invention, the second-stage PLL 102 may comprise a second phase detector (PD), a second low-pass filter (LPF), a second voltage-controlled oscillator (VCO), and a second frequency divider (½); wherein the second PD performs the phase difference detection between the clock signal 1011 of the synchronization clock after frequency increase by the first-stage PLL 101 and the output of the second VCO, and transmits the detection result to the second LPF; the design objective of the second LPF, different from the first LPF, is to reduce the timing jitter of the clock signal of the synchronization clock after frequency increase by the first-stage PLL, which requires the second LPF to be designed in an over-damping state and the stabilization time is within a few ms; and, the output of the second VCO is transmitted to the second frequency divider, and the second frequency divider (½) divides the output by 2; the second frequency divider performs duty cycle adjustment so as to output the signal to DAC 105 and ADC 106 for use.

Figure 2:
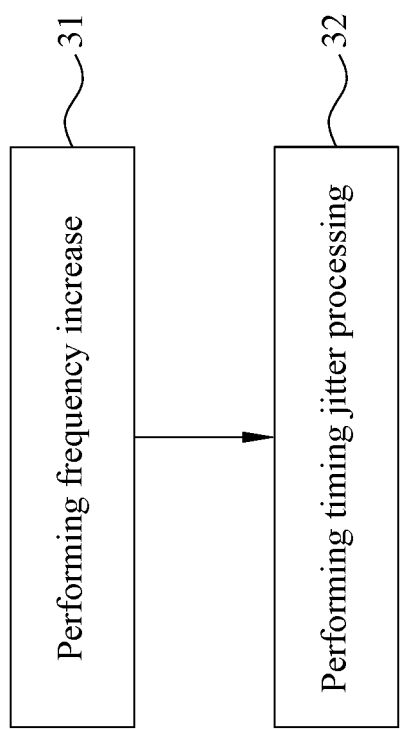
FIG. 2 shows a flowchart of the clock signal processing method used in the clock signal processing system in FIG. 1.

FIG. 2 shows a flowchart of the clock signal processing method used in the clock signal processing system in FIG. 1.

As shown in FIG. 2, in step 31, performing frequency increase: using the first-stage PLL 101 via the USB interface 100 to increase the frequency of the inputted USB SOF and providing the synchronization clock and outputting to the second-stage PLL 102.

Wherein the first-stage PLL 101, after receiving the SOF, for example, will output a clock of 49152-times to the second-stage PLL 102; the first-stage PLL 101 serves to perform frequency increase/clock synchronization.

In step 32, performing timing jitter: using the second-stage PLL 102 to reduce the timing jitter of the clock signal 1011 outputted by the first-stage PLL 101 to below 20 ps.

Wherein, the second-stage PLL 102 improves the clock signal of the synchronization clock after frequency increase by the first-stage PLL 101; the second-stage PLL 102 reduces the timing jitter of the clock signal 1011, and outputs the clock signal 1021 after jittery processing to DAC 105 and ADC 106; and, the second-stage PLL 102 reduces the timing jitter of the clock signal 1011 outputted by the first-stage PLL 101 to below 20 ps.

Figure 3:
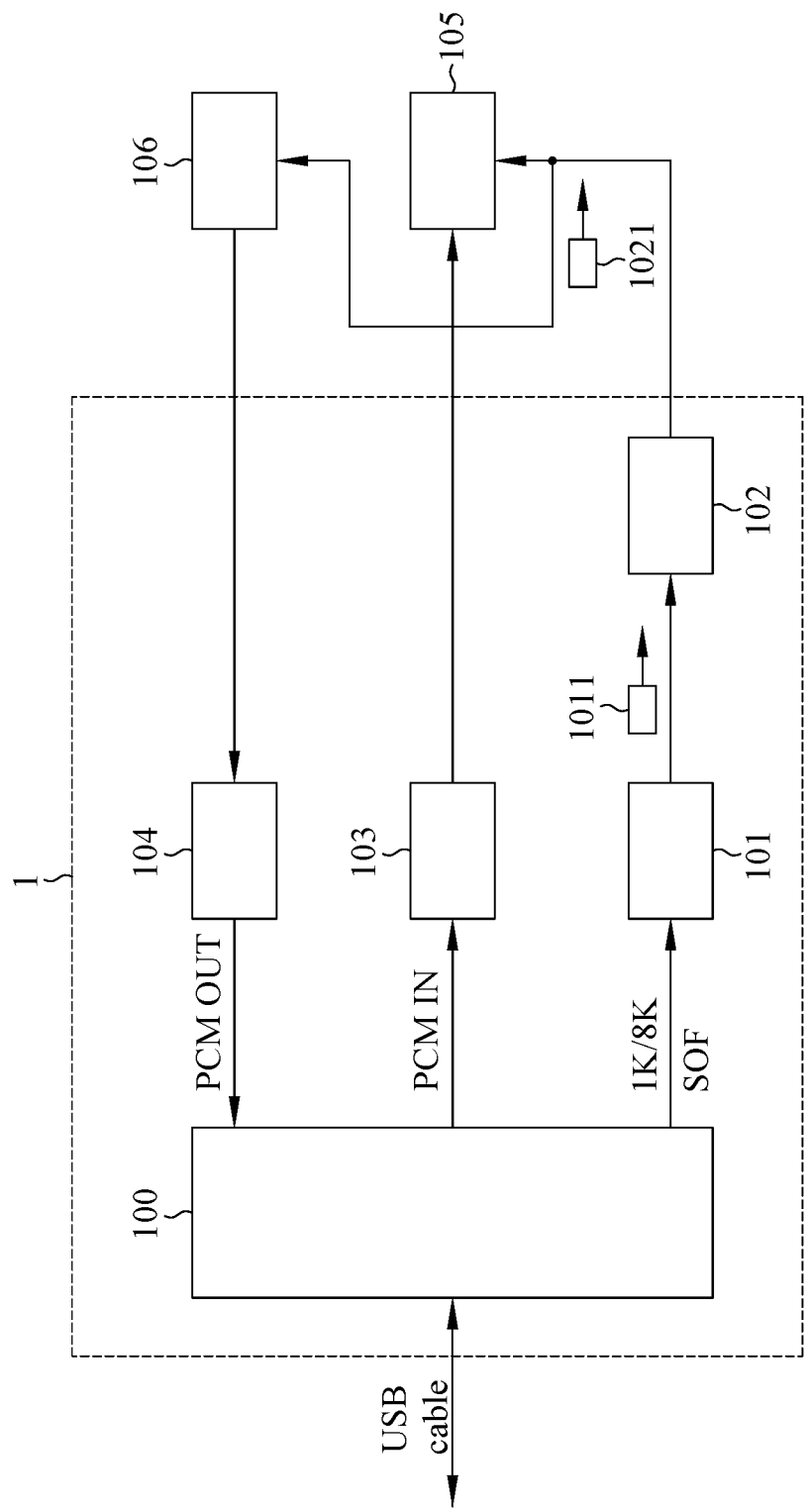
FIG. 3 shows a schematic view of an embodiment of the clock signal processing system and operation in collaboration with USB interface, DAC, and ADC according to the present invention.

FIG. 3 shows a schematic view of an embodiment of the clock signal processing system and operation in collaboration with USB interface, DAC, and ADC according to the present invention. As shown in FIG. 3, the clock signal processing system 1 comprises a first-stage phase-locked loop (PLL) 101, a second-stage PLL 102, a first first-in-first-out (FIFO) buffer 103, and a second FIFO buffer 104.

The first-stage PLL101: the first-stage PLL 101 is connected to the USB interface 100, the USB interface 100 receives/transmits to input/output audio data from/to USB host (not shown) via a USB cable, the USB interface 100 transmits the start of frame (SOF) (for example, 1 KHz or 8 KHz) to an input end of the first-stage PLL 101, the USB interface 100 transmits pulse code modulation (PCM IN) signal to the first FIFO buffer 103, the USB interface 100 then receives pulse code modulation signal (PCM OUT) from the second FIFO buffer 104; and after the first-stage PLL 101 receives the SOF (for example, 1 KHz or 8 KHz), for example, the first-stage PLL 101 will output a 1024*48 KHz clock to the second-stage PLL 102, and the tasks performed by first-stage PLL 101 is frequency increase/clock synchronization.

The second-stage PLL 102: the second-stage PLL 102 will improve the clock signal 1011 of the synchronization clock received from the first-stage PLL 101 after frequency increase; the second-stage PLL 102 reduces the timing jitter of the clock signal 1011, and then outputting the clock signal 1021 (for example, after being divided by 2, 512*48KHz) after timing jitter processing to digital-analog-converter (DAC) 105 and analog-digital-converter (ADC) 106; wherein the second-stage PLL 102 reduces the timing jitter of the first-stage PLL 101 output to below 20 ps.

The first FIFO buffer 103: the first FIFO 103 buffer is for the DAC 105 to temporarily store a small amount of data (depth<100), and is able to store a SOF data (not shown) transmitted from a host via the USB interface 100, and the data can be read by the DAC 105.

The second FIFO buffer 104: the second FIFO buffer 104 is to temporarily store a small amount of data (depth<100) to be outputted by ADC 106, via the USB interface 100, the data in the second FIFO buffer 104 is read by way of each SOF and transmitted to the host.

In actual application, the clock signal processing system of the present invention uses the first-stage PLL 101 and the second-stage PLL 102, with the first-stage PLL 101 to increase the frequency of the SOF (1 KHz or 8 KHz), and the second-stage PLL 102 to perform timing jitter reduction on clock signal 1011 of the synchronization clock after the frequency increase so that the clock signal 1021 (such as, 512*48KHz) after timing jitter reduction is provided to the DAC 105 and ADC 106. When stabilized, the clock CLK of the DAC 105 is synchronized with the SOF and the audio data of the audio from the USB interface 100 is also synchronized with the SOF; therefore, the clock CLK used by the DAC 105 is synchronized with the data DATA of the first FIFO buffer 103 and without discontinuity. As a result, the first FIFO buffer 103 is only necessary to accommodate the data amount of an SOF, and hence, the data delay from the USB host, USB interface 100 to the DAC 105 is very short.

Figure 4:
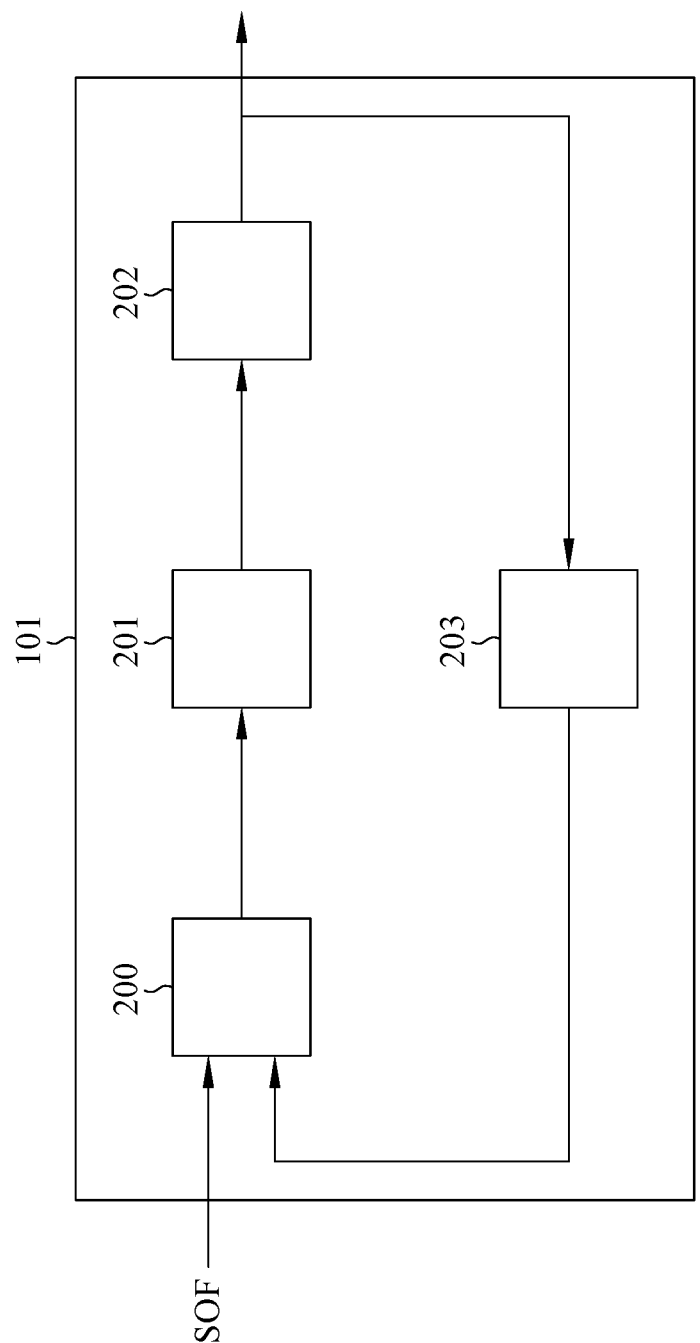
FIG. 4 shows a schematic view of the first-stage PLL in the embodiment of FIG. 3.

FIG. 4 shows a schematic view of the first-stage PLL in the embodiment of FIG. 3.

In the present embodiment, the first-stage PLL 101 may comprise a first phase detector (PD) 200, a first low-pass filter (LPF) 201, a first voltage-controlled oscillator (VCO) 202, and a first frequency divider (1/N) 203; wherein the first PD 200 performs the phase difference detection between the SOF and the output of the first frequency divider (dividing by N), and transmits the detection result to the first LPF 201; and the first LPF 201 performs low-pass filtering on the signal with phase difference and transmits to the first VCO 202, the first VCO 202 will transmit to the first frequency divider 203 and the second-stage PLL 102 (such as, 1024*48KHz), wherein the first LPF 201 is designed to be able to accept very low frequency input (as low as 1 KHz).

Figure 5:
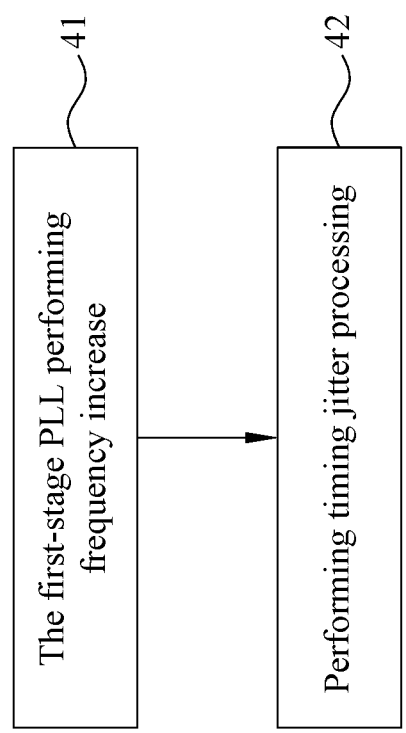
FIG. 5 shows a flowchart of an embodiment of the clock signal processing method used by the embodiment of the clock signal processing system of FIG. 3 according to the present invention.

FIG. 5 shows a flowchart of an embodiment of the clock signal processing method used by the embodiment of the clock signal processing system of FIG. 3 according to the present invention.

As shown in FIG. 5, in step 41, performing frequency increase: using the first-stage PLL 101 via the USB interface 100 to increase the frequency of the inputted USB SOF and providing the synchronization clock and outputting to the second-stage PLL 102, and then proceed to step 42.

Wherein the first-stage PLL 101, after receiving the SOF (for example, 1 KHz or 8 KHz), for example, will output a clock of 1024*8 KHz to the second-stage PLL 102; the first-stage PLL 101 serves to perform frequency increase/clock synchronization.

In step 42, performing timing jitter: using the second-stage PLL 102 to reduce the timing jitter of the clock signal 1011 outputted by the first-stage PLL 101 to below 20 ps.

Wherein, the second-stage PLL 102 improves the clock signal of the synchronization clock after frequency increase by the first-stage PLL 101; the second-stage PLL 102 reduces the timing jitter of the clock signal 1011, and outputs the clock signal 1021 (for example, 512*8 KHz) after jittery processing to DAC 105 and ADC 106; and, the second-stage PLL 102 reduces the timing jitter of the clock signal 1011 outputted by the first-stage PLL 101 to below 20 ps.

Figure 6:
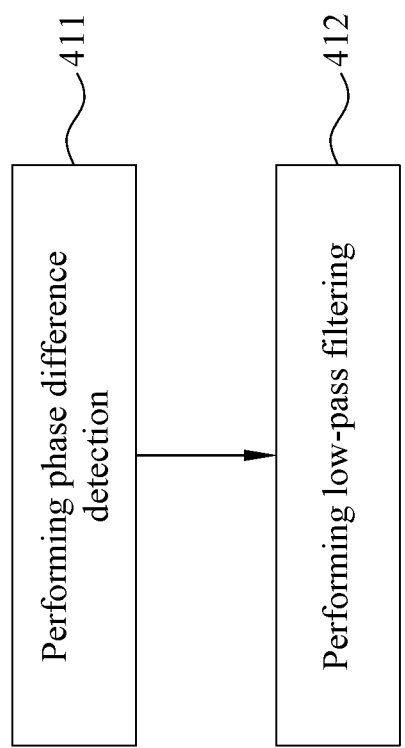
FIG. 6 shows a flowchart of detailed steps of performing the frequency increase of the clock signal processing method in FIG. 5.

FIG. 6 shows a flowchart of detailed steps of performing the frequency increase of the clock signal processing method in FIG. 5.

First, in step 411, performing phase difference detection: the first PD 200 performs phase difference between the SOF (for example, 1 KHz or 8 KHz) and the output of the first frequency divider (divided by N), and then transmits the signal with phase difference to the first LPF 201, and proceed to step 412.

In step 412, performing low-pass filtering: the first LPF 201 performs low-pass filtering on the signal with phase difference, and transmits to the first VCO 202; the first VCO 202 transmits to the first frequency divider 203 and the second-stage PLL 102 (for example, 1024*8 KHz clock), wherein the first LPF 201 is designed to accept very low frequency input (as low as 1 KHz).

Figure 7:
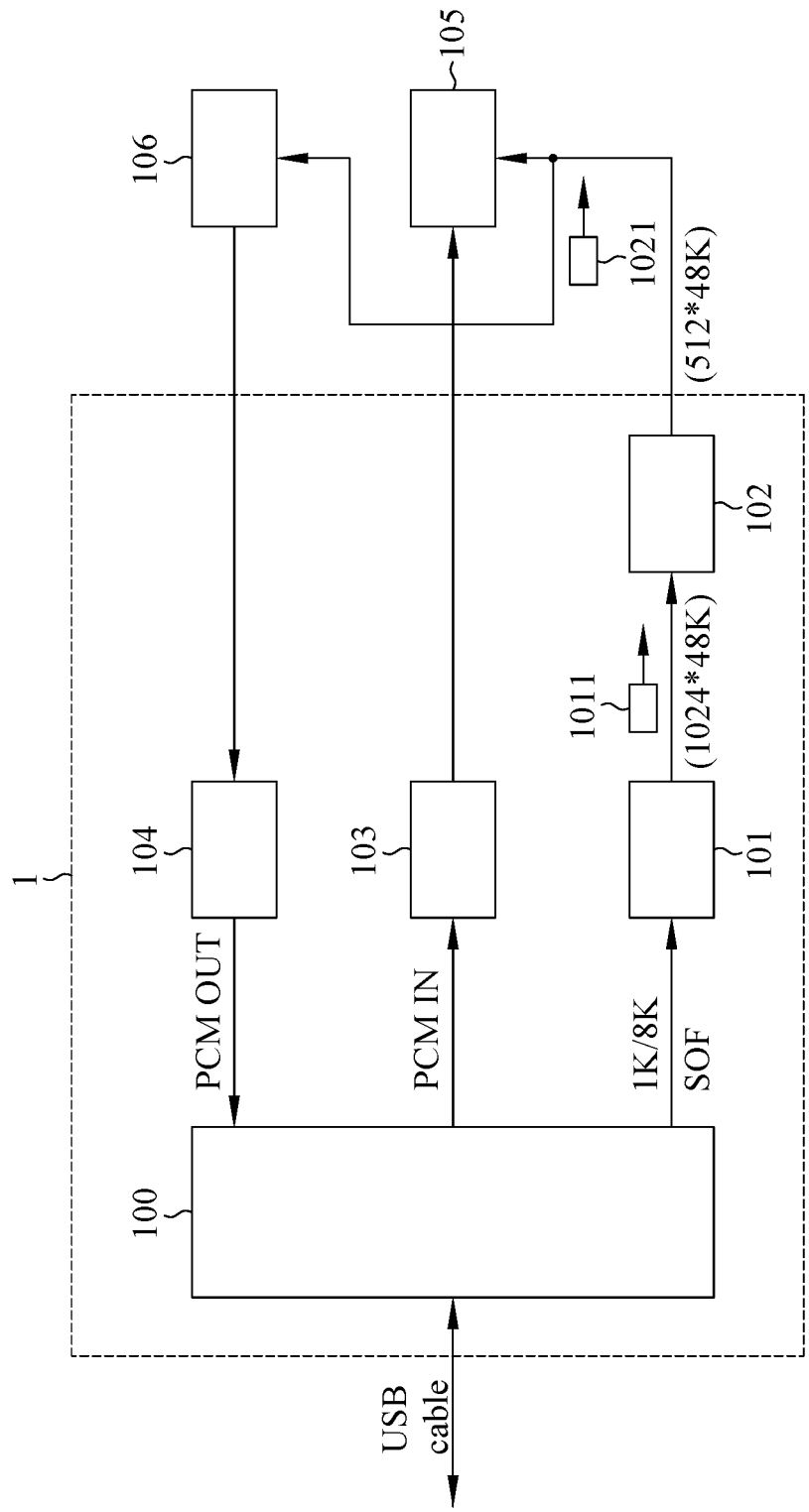
FIG. 7 shows a schematic view of another embodiment of the clock signal processing system and operation in collaboration with USB interface, DAC, and ADC according to the present invention.

FIG. 7 shows a schematic view of another embodiment of the clock signal processing system and operation in collaboration with USB interface, DAC, and ADC according to the present invention. As shown in FIG. 7, the clock signal processing system 1 comprises a first-stage phase-locked loop (PLL) 101, a second-stage PLL 102, a first first-in-first-out (FIFO) buffer 103, and a second FIFO buffer 104.

The first-stage PLL101: the first-stage PLL 101 is connected to the USB interface 100, the USB interface 100 receives/transmits to input/output audio data from/to USB host (not shown) via a USB cable, the USB interface 100 transmits the start of frame (SOF) (for example, 1 KHz or 8 KHz) to an input end of the first-stage PLL 101, the USB interface 100 transmits pulse code modulation (PCM IN) signal to the first FIFO buffer 103, the USB interface 100 then receives pulse code modulation signal (PCM OUT) from the second FIFO buffer 104; and after the first-stage PLL 101 receives the SOF (for example, 1 KHz or 8 KHz), for example, the first-stage PLL 101 will output a 1024*48 KHz clock to the second-stage PLL 102, and the tasks performed by first-stage PLL 101 is frequency increase/clock synchronization.

The second-stage PLL 102: the second-stage PLL 102 will improve the clock signal 1011 of the synchronization clock received from the first-stage PLL 101 after frequency increase; the second-stage PLL 102 reduces the timing jitter of the clock signal 1011, and then outputting the clock signal 1021 (for example, after being divided by 2, 512*48KHz) after timing jitter processing to digital-analog-converter (DAC) 105 and analog-digital-converter (ADC) 106; wherein the second-stage PLL 102 reduces the timing jitter of the first-stage PLL 101 output to below 20 ps.

The first FIFO buffer 103: the first FIFO 103 buffer is for the DAC 105 to temporarily store a small amount of data (depth<100), and is able to store a SOF data (not shown) transmitted from a host via the USB interface 100, and the data can be read by the DAC 105.

The second FIFO buffer 104: the second FIFO buffer 104 is to temporarily store a small amount of data (depth<100) to be outputted by ADC 106, via the USB interface 100, the data in the second FIFO buffer 104 is read by way of each SOF and transmitted to the host.

In actual application, the clock signal processing system of the present invention uses the first-stage PLL 101 and the second-stage PLL 102, with the first-stage PLL 101 to increase the frequency of the SOF (1 KHz or 8 KHz), and the second-stage PLL 102 to perform timing jitter reduction on clock signal 1011 of the synchronization clock after the frequency increase so that the clock signal 1021 (such as, 512*48KHz) after timing jitter reduction is provided to the DAC 105 and ADC 106. When stabilized, the clock CLK of the DAC 105 is synchronized with the SOF and the audio data of the audio from the USB interface 100 is also synchronized with the SOF; therefore, the clock CLK used by the DAC 105 is synchronized with the data DATA of the first FIFO buffer 103 and without discontinuity. As a result, the first FIFO buffer 103 is only necessary to accommodate the data amount of an SOF, and hence, the data delay from the USB host, USB interface 100 to the DAC 105 is very short.

Figure 8:
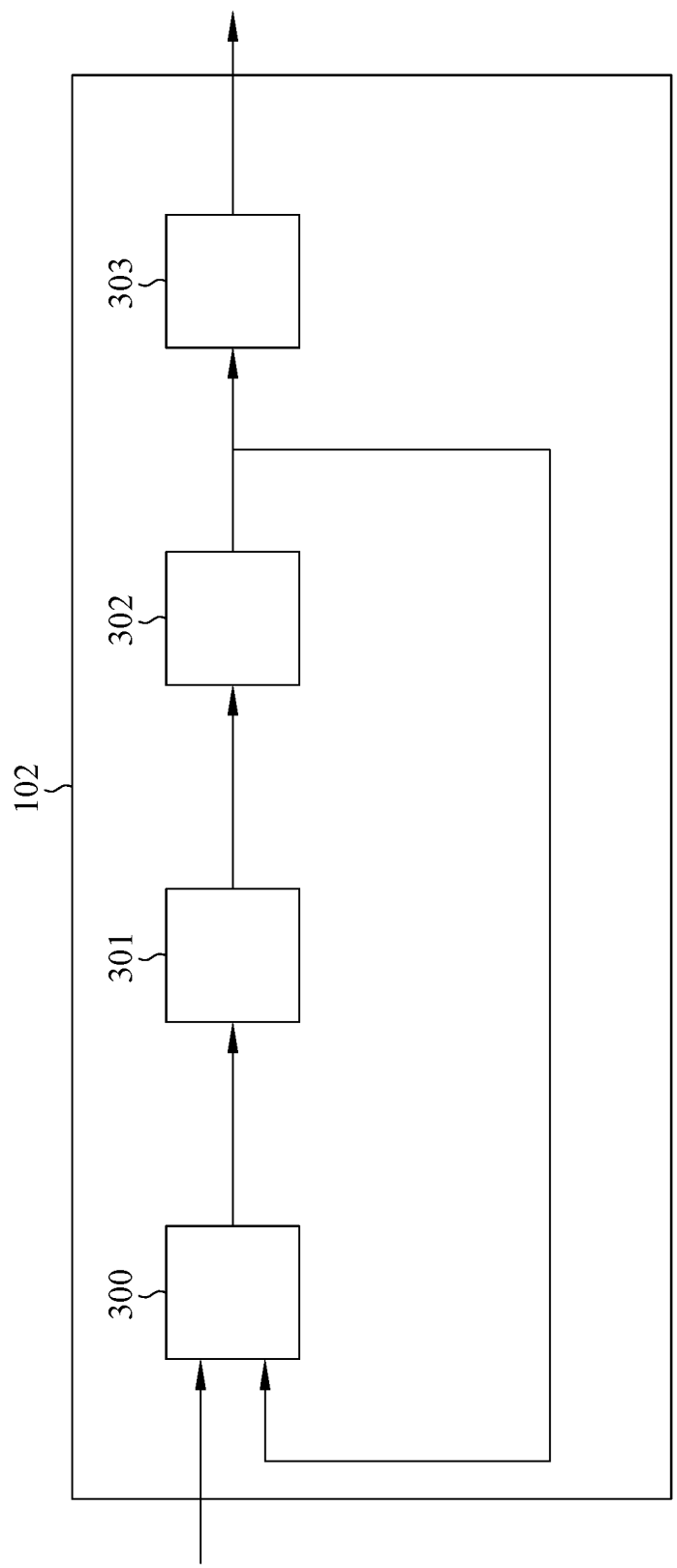
FIG. 8 shows a schematic view of the second-stage PLL in the embodiment of FIG. 7.

FIG. 8 shows a schematic view of the second-stage PLL in the embodiment of FIG. 7.

In the present embodiment, the second-stage PLL 102 may comprise a second phase detector (PD) 300, a second low-pass filter (LPF) 301, a second voltage-controlled oscillator (VCO) 302, and a second frequency divider (½) 303; wherein the second PD 300 performs the phase difference detection between the clock signal 1011 of the synchronization clock after frequency increase by the first-stage PLL 101 and the output of the second VCO 302, and transmits the detection result to the second LPF 301; the design objective of the second LPF 301, different from the first LPF 201, is to reduce the timing jitter of the clock signal 1011 of the synchronization clock after frequency increase by the first-stage PLL 101, which requires the second LPF 301 to be designed in an over-damping state and the stabilization time is within a few ms; and, the output of the second VCO 302 is transmitted to the second frequency divider 303, and the second frequency divider (½) 303 divides the output by 2; the second frequency divider 303 performs duty cycle adjustment so as to output the signal to DAC 105 and ADC 106 for use.

In other words, the processing process of the second-stage PLL 102 comprises: first performing phase difference detection: the second PD 300 compares the clock signal 1011 (for example, 1024*48 KHz) of the synchronization clock after frequency increase by the first-stage PLL 101 and the output of the second VCO 302 for phase difference detection, and transmits the signal after phase difference detection to the second LPF 301.

Then, performing low-pass filtering: the second LPF 301 performs the low-pass filtering on the signal with phase difference, and transmits to the second VCO 302; the second VCO 302 will transmits, for example, the 1024*48 KHz clock signal to the second frequency divider (½) 303 and the second PD 300; wherein the design objective of the second LPF 301, different from the first LPF 201, is to reduce the timing jitter of the clock signal 1011 of the synchronization clock after frequency increase by the first-stage PLL 101, which requires the second LPF 301 to be designed in an over-damping state and the stabilization time is within a few milliseconds (ms).

Then, performing frequency division: the output of the second VCO (for example, 1024*8 KHz) is transmitted to the second frequency divider (½) 303; and the second frequency divider 303 divides the frequency by 2. The second frequency divider 303 performs duty cycle adjustment so as to output the clock signal 1021 (for example, 512*48 KHz) to DAC 105 and ADC 106 for use.

Figure 9:
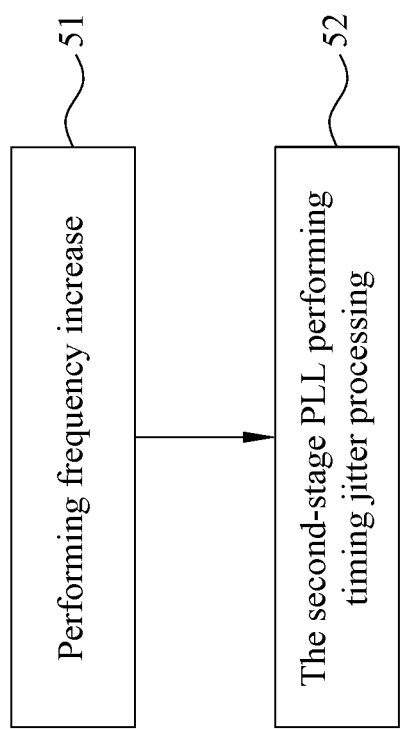
FIG. 9 shows a flowchart of an embodiment of the clock signal processing method used by the embodiment of the clock signal processing system of FIG. 7 according to the present invention.

FIG. 9 shows a flowchart of an embodiment of the clock signal processing method used by the embodiment of the clock signal processing system of FIG. 7 according to the present invention.

As shown in FIG. 9, in step 51, performing frequency increase: using the first-stage PLL 101 via the USB interface 100 to increase the frequency of the inputted USB SOF and providing the synchronization clock and outputting to the second-stage PLL 102, and then proceed to step 52.

Wherein the first-stage PLL 101, after receiving the SOF (for example, 1 KHz or 8 KHz), for example, will output a clock of 1024*8 KHz to the second-stage PLL 102; the first-stage PLL 101 serves to perform frequency increase/clock synchronization.

In step 52, performing timing jitter: using the second-stage PLL 102 to reduce the timing jitter of the clock signal 1011 outputted by the first-stage PLL 101 to below 20 ps.

Wherein, the second-stage PLL 102 improves the clock signal of the synchronization clock after frequency increase by the first-stage PLL 101; the second-stage PLL 102 reduces the timing jitter of the clock signal 1011, and outputs the clock signal 1021 (for example, 512*8 KHz) after jittery processing to DAC 105 and ADC 106; and, the second-stage PLL 102 reduces the timing jitter of the clock signal 1011 outputted by the first-stage PLL 101 to below 20 ps.

Figure 10:
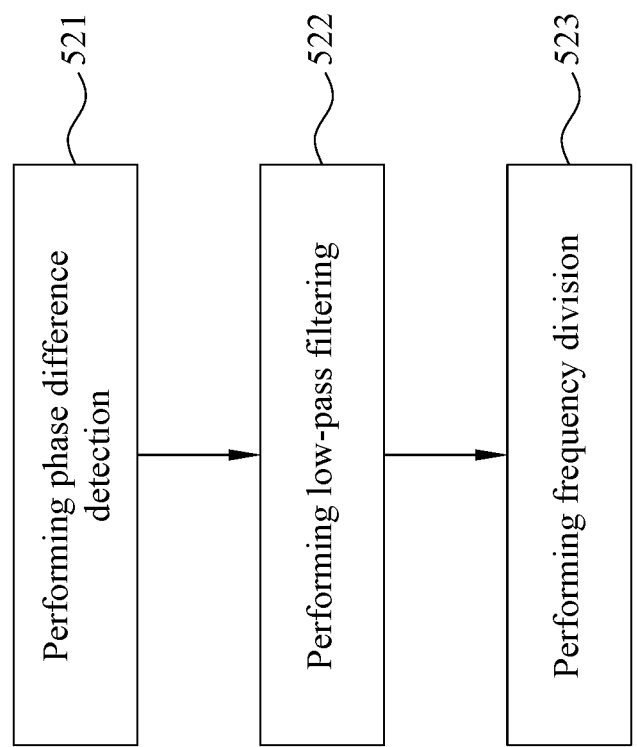
FIG. 10 shows a flowchart of detailed steps of performing the timing jittery processing of the clock signal processing method in FIG. 9.

FIG. 10 shows a flowchart of detailed steps of performing the frequency increase of the clock signal processing method in FIG. 9.

First, in step 521, performing phase difference detection: the second PD 300 compares the clock signal 1011 (for example, 1024*48 KHz) of the synchronization clock after frequency increase by the first-stage PLL 101 and the output of the second VCO 302 for phase difference detection, and transmits the signal after phase difference detection to the second LPF 301, and proceed to step 522.

Then, in step 522, performing low-pass filtering: the second LPF 301 performs the low-pass filtering on the signal with phase difference, and transmits to the second VCO 302; the second VCO 302 will transmit, for example, the 1024*48KHz clock signal to the second frequency divider (½) 303 and the second PD 300; wherein the design objective of the second LPF 301, different from the first LPF 201, is to reduce the timing jitter of the clock signal 1011 of the synchronization clock after frequency increase by the first-stage PLL 101, which requires the second LPF 301 to be designed in an over-damping state and the stabilization time is within a few milliseconds (ms).

Then, in step 523, performing frequency division: the output of the second VCO (for example, 1024*8 KHz) is transmitted to the second frequency divider (½) 303; and the second frequency divider 303 divides the frequency by 2. The second frequency divider 303 performs duty cycle adjustment so as to output the clock signal 1021 (for example, 512*48 KHz) to DAC 105 and ADC 106 for use.

In summary, the present invention provides a clock signal processing system and method thereof, applicable to an environment of audio clock reconstruction for USB audio synchronous mode, by using a first-stage phase locked loop (PLL) to increase the frequency of USB start of frame (SOF), providing clock synchronization, and outputting to a second-stage PLL; then, using the second-stage PLL to reduce the timing jitter outputted by the first-stage PLL to below 20 ps. The clock signal processing system and method thereof provides the following advantages:

In an environment of audio clock reconstruction for USB audio synchronous mode, using a first-stage phase locked loop (PLL) to increase the frequency of USB start of frame (SOF), providing clock synchronization, and outputting to a second-stage PLL; then, using the second-stage PLL to reduce the timing jitter outputted by the first-stage PLL to below 20 ps.

Using dual PLLs to lock and synchronization clock with system on chip (SOC).

Using the first-stage PLL to increase the USB SOF, mainly providing clock synchronization, and the second-stage PLL to reduce the output timing jitter of the first-stage PLL to below 20 ps.

When the DAC/ADC clock is synchronized with USB SOF, a small buffer (<100) can be used to store the amount of data SOF data without using deep buffer (>1000) to achieve normal discontinuity-free playback; and moreover, with a small buffer, the audio delay is also improved to below 1 ms.

Able to improve timing jitter, greatly reduce FIFI buffer size, increase audio SNR, and reduce audio delay.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A clock signal processing method, applicable to an environment of audio clock reconstruction for universal serial bus (USB) audio synchronous mode, comprising the following steps:
    performing frequency increase: increasing the frequency of an inputted USB start-of-frame (SOF), and outputting a higher frequency clock signal, the frequency of the higher frequency clock signal being the increased frequency of the inputted USB SOF; and
    performing timing jitter processing: receiving the higher frequency clock signal and reducing timing jitter on the higher frequency clock signal;
    wherein in the step of performing frequency increase, a first-stage phase-locked loop (PLL) is used to increase the frequency of the inputted USB SOF to provide the higher frequency clock signal, and output the higher frequency clock signal to a second-stage PLL.

2. The clock signal processing method as claimed in claim 1, wherein the step of performing frequency increase comprises the following steps:
    performing phase difference detection: the first-stage PLL performing phase difference detection between the inputted USB SOF and a frequency divided signal of the higher frequency clock signal; and
    performing low-pass filtering: the first-stage PLL performing low-pass filtering on the higher frequency clock signal with the detected phase difference, and transmitting the higher frequency clock signal after low-pass filtering to the second-stage PLL.

3. The clock signal processing method as claimed in claim 1, wherein the step of performing timing jitter processing comprises the following steps:

performing phase difference detection: the second-stage PLL performing phase difference detection on the higher frequency clock signal received from the first-stage PLL;

performing low-pass filtering: the second-stage PLL performing low-pass filtering on the higher frequency clock signal with the detected phase difference to reduce timing jitter; and performing frequency division: the second-stage PLL performing frequency division processing on the higher frequency clock signal.

4. A clock signal processing system, applicable to an environment of audio clock reconstruction for universal serial bus (USB) audio synchronous mode, comprising:
   a USB interface, for receiving/transmitting audio data;
   a first-stage phase-locked loop (PLL), through the USB interface, used for increasing frequency of an inputted USB start-of-frame (SOF), and outputting a higher frequency clock signal, the frequency of the higher frequency clock signal being the increased frequency of the inputted USB SOF;
   a second-stage PLL, used for receiving the higher frequency clock signal from the first-stage PLL and reducing timing jitter on the higher frequency clock signal.

5. The clock signal processing system as claimed in claim 4, wherein the first-stage PLL performs phase difference detection between the inputted USB SOF and a frequency divided signal of the higher frequency clock signal; and the first-stage PLL performs low-pass filtering on the higher frequency clock signal with the detected phase difference, and transmitting the higher frequency clock signal after low-pass filtering to the second-stage PLL.

6. A clock signal processing system, applicable to an environment of audio clock reconstruction for universal serial bus (USB) audio synchronous mode, comprising:
   a USB interface;
   a first-stage phase-locked loop (PLL): the first-stage PLL being connected to the USB interface, the USB interface receiving/transmitting to input/output audio data from/to a USB host, the USB interface transmitting start of frame (SOF) to an input end of the first-stage PLL, the first-stage PLL being used for increasing frequency of the inputted USB start-of-frame (SOF), and outputting a higher frequency clock signal, the frequency of the higher frequency clock signal being the increased frequency of the inputted USB SOF;
   a second-stage PLL: the second-stage PLL being used for receiving the higher frequency clock signal from the first-stage PLL and reducing timing jitter on the higher frequency clock signal; the second-stage PLL outputting the higher frequency clock signal after timing jitter processing to a digital-analog-converter (DAC) and an analog-digital-converter (ADC);
   a first first-in-first-out (FIFO) buffer: the USB interface transmitting a pulse cycle modulation PCM IN signal to the first FIFO buffer, and the first FIFO buffer being for the DAC to temporarily store data;
   a second FIFO buffer: the USB interface receiving a pulse cycle modulation PCM OUT signal from the second FIFO buffer, and the second FIFO buffer being for temporarily storing data from the ADC.

7. The clock signal processing system as claimed in claim 6, wherein the first-stage PLL performs phase difference detection between the inputted USB SOF and a frequency divided signal of the higher frequency clock signal; and the first-stage PLL performs low-pass filtering on the higher frequency clock signal with the detected phase difference, and transmitting the higher frequency clock signal after low-pass filtering to the second-stage PLL.

8. The clock signal processing system as claimed in claim 6, wherein the second PLL performs phase difference detection on the higher frequency clock signal received from the first-stage PLL; and the second-stage PLL performs low-pass filtering on the higher frequency clock signal with the detected phase difference to reduce timing jitter of the higher frequency clock signal, and performs frequency division processing on the higher frequency clock signal.

* * * * *